(12) United States Patent
Ichikawa et al.

(10) Patent No.: US 10,710,495 B2
(45) Date of Patent: Jul. 14, 2020

(54) AUTOMOTIVE LAMP

(71) Applicant: KOITO MANUFACTURING CO., LTD., Tokyo (JP)

(72) Inventors: Tomoyuki Ichikawa, Shizuoka (JP); Satoshi Kikuchi, Shizuoka (JP)

(73) Assignee: KOITO MANUFACTURING CO., LTD., Minato-Ku, Tokyo (JP)

( * ) Notice: Subject to any disclaimer, the term of this patent is extended or adjusted under 35 U.S.C. 154(b) by 7 days.

(21) Appl. No.: 16/117,962

(22) Filed: Aug. 30, 2018

(65) Prior Publication Data

US 2019/0016249 A1 Jan. 17, 2019

Related U.S. Application Data

(63) Continuation of application No. PCT/JP2017/006743, filed on Feb. 23, 2017.

(30) Foreign Application Priority Data

Mar. 3, 2016 (JP) ................................ 2016-041377

(51) Int. Cl.
*B60Q 1/14* (2006.01)
*B60Q 1/00* (2006.01)
(Continued)

(52) U.S. Cl.
CPC .............. *B60Q 1/1415* (2013.01); *B60Q 1/00* (2013.01); *B60Q 1/14* (2013.01); *H01L 33/00* (2013.01);
(Continued)

(58) Field of Classification Search
CPC .......... B60Q 1/1415; B60Q 1/14; B60Q 1/00; H01L 33/00; H05B 33/0815;
(Continued)

(56) References Cited

U.S. PATENT DOCUMENTS

| 2014/0070728 A1* | 3/2014 | Pflaum | H05B 45/37 315/307 |
| 2016/0066378 A1* | 3/2016 | Wang | H05B 45/37 307/31 |
| 2016/0105939 A1* | 4/2016 | Lee | H05B 47/105 315/201 |

FOREIGN PATENT DOCUMENTS

| CN | 102037783 A | 4/2011 |
| CN | 103687184 A | 3/2014 |

(Continued)

OTHER PUBLICATIONS

M. Bodetto et al., "Sliding Mode Control of a Cuk Converter with Variable Hysteresis Width for HBLEDs Applications", 2014 IEEE 11th International Multi-Conference on Systems, Signals & Devices (SSD14), Feb. 11, 2014, pp. 1-6.

(Continued)

*Primary Examiner* — Raymond R Chai
(74) *Attorney, Agent, or Firm* — Buchanan Ingersoll & Rooney PC

(57) ABSTRACT

A current detection circuit generates a current detection signal $V_{CS}$ that corresponds to a lamp current $I_{LAMP}$ supplied from a switching converter to a semiconductor light source. A hysteresis comparator compares a current detection signal $V_{CS}$ with an upper-side threshold signal $V_{THH}$ and a lower-side threshold signal $V_{THL}$ determined according to an analog dimming signal, and generates a control pulse $S_{CNT}$ that corresponds to the comparison result. A driver drives a switching transistor according to the control pulse. A PWM dimming circuit generates a gradual change signal by dulling a PWM (pulse width modulation) dimming signal, and changes the analog dimming signal based on the gradual change signal.

6 Claims, 12 Drawing Sheets

(51) Int. Cl.
*H01L 33/00* (2010.01)
*H05B 45/37* (2020.01)
*H05B 45/48* (2020.01)
*H02M 1/08* (2006.01)
*H02M 1/44* (2007.01)
*H02M 3/156* (2006.01)
*H02M 1/00* (2006.01)

(52) U.S. Cl.
CPC .............. *H02M 1/08* (2013.01); *H02M 1/44* (2013.01); *H02M 3/156* (2013.01); *H05B 45/37* (2020.01); *H05B 45/48* (2020.01); *H02M 2001/0003* (2013.01)

(58) Field of Classification Search
CPC ...... H05B 33/083; H05B 45/37; H05B 45/48; H05B 45/375; H02M 3/156; H02M 1/44; H02M 1/08; H02M 2001/0003

See application file for complete search history.

(56) References Cited

FOREIGN PATENT DOCUMENTS

| | | |
|---|---|---|
| CN | 104902630 A | 9/2015 |
| JP | 2012-226917 | 11/2012 |
| JP | 2014-216600 | 11/2014 |
| JP | 2016-058240 | 4/2016 |

OTHER PUBLICATIONS

Chinese Official Action dated Jul. 30, 2019 issued by the Chinese Patent Office in Chinese Patent Application No. 201780014894.1, with English translation (17 pages).
Extended European Search Report dated Sep. 5, 2019 issued by the European Patent Office in corresponding European Patent Application No. 17759788.7 (7 pages).
International Search Report on corresponding PCT international application No. PCT/JP2017/006743, dated May 16, 2017.
International Preliminary Report on Patentability on corresponding PCT international application No. PCT/JP2017/006743, dated Sep. 4, 2018.
Chinese Office Action and English translation issued in corresponding Chinese Application No. 201780014894.1 Feb. 26, 2020 (13 pages).

* cited by examiner

AUTOMOTIVE LAMP

BACKGROUND OF THE INVENTION

1. Field of the Invention

The present invention relates to an automotive lamp employed in a vehicle or the like.

2. Description of the Related Art

Typical automotive lamps are capable of switching between a low-beam mode and a high-beam mode. The low-beam mode is used to illuminate a close range with a predetermined light intensity. In the low-beam mode, light distribution is determined so as to prevent glare being imparted to an oncoming vehicle or a leading vehicle. The low-beam mode is mainly used when the vehicle is traveling in an urban area. In contrast, the high-beam mode is used to illuminate a distant range over a wide area ahead of the vehicle with a relatively high light intensity. The high-beam mode is mainly used when the vehicle is traveling at high speed along a road where there are a small number of oncoming vehicles and leading vehicles. Accordingly, the high-beam mode provides the driver with high visibility, which is an advantage, as compared with the low-beam mode. However, this leads to a problem of imparting glare to a pedestrian or otherwise a driver of a leading vehicle ahead of the vehicle.

In recent years, the ADB (Adaptive Driving Beam) technique has been proposed in which the high-beam distribution pattern is dynamically and adaptively controlled based on the state of the surroundings of the vehicle. With the ADB technique, the presence or absence of a leading vehicle, an oncoming vehicle, or a pedestrian ahead of the vehicle is detected, and the illumination is reduced for a region that corresponds to such a vehicle or pedestrian thus detected, thereby reducing glare imparted to such a vehicle or pedestrian.

In many cases, a switching converter is used to turn on a light source of an automotive lamp. With the ADB control operation, there is a need to turn on and off the light source at high speed and to change the light amount at high speed. In order to meet such a request, the present inventor has investigated an arrangement employing a hysteresis control method (Bang-Bang control) that provides high responsivity. FIG. 1 is a block diagram showing an automotive lamp employing a hysteresis control method investigated by the present inventors. It should be noted that this comparison technique thus investigated should not be recognized as a known technique.

An automotive lamp 1r includes a semiconductor light source 10 and a lighting circuit 20r. The semiconductor light source 10 includes a semiconductor device such as an LED (light-emitting diode), an LD (laser diode), or the like. The lighting circuit 20r includes a switching converter 30r and a converter controller 32r.

The switching converter 30r receives a battery voltage $V_{BAT}$ (which will also be referred to as the "input voltage $V_{IN}$") from a battery 2 via a switch 4, and supplies a lamp current (driving current) $I_{LAMP}$ to the semiconductor light source 10. For example, the switching converter 30r is configured as a step-down converter (Buck converter) including an input capacitor C1, a switching transistor M1, a diode D1, and an inductor L1.

The converter controller 32r detects the lamp current $I_{LAMP}$, and adjusts the duty ratio of the switching of the switching transistor M1 such that the lamp current $I_{LAMP}$ matches a target current $I_{REF}$ that corresponds to a target light amount of the semiconductor light source 10. The converter controller 32r is configured as a controller employing a hysteresis control method, including a current detection circuit 34, a hysteresis comparator 36, and a driver 38. A current sensing resistor (which will be referred to as the "sensing resistor" hereafter) $R_{CS}$ is arranged on a path of the lamp current $I_{LAMP}$ in the switching converter 30r. A voltage drop occurs across the sensing resistor $R_{CS}$ in proportion to the lamp current $I_{LAMP}$. The current detection circuit 34 generates a current detection signal $V_{CS}$ that represents the existing coil current $I_{LAMP}$ based on the voltage drop that occurs across the sensing resistor $R_{CS}$.

The hysteresis comparator 36 compares the current detection signal $V_{CS}$ with a pair of threshold signals $V_{THL}$ and $V_{THH}$ determined according to a reference voltage $V_{REF}$, and generates a control pulse $S_{CNT}$ that corresponds to a comparison result. Specifically, when the current detection signal $V_{CS}$ reaches an upper-side threshold signal $V_{THH}$ that corresponds to a peak value $I_{PEAK}$ of the lamp current $I_{LAMP}$, the control pulse $S_{CNT}$ is switched to a first level. When the current detection signal $V_{CS}$ reaches a lower-side threshold signal $V_{THL}$ that corresponds to a bottom value $I_{BOTTOM}$ of the lamp current $I_{LAMP}$, the control pulse $S_{CNT}$ is switched to a second level. The driver 38 drives the switching transistor M1 according to the control pulse $S_{CNT}$.

The lamp current $I_{LAMP}$ reciprocates between the peak current $I_{PEAK}$ and the bottom value $I_{BOTTOM}$. Accordingly, the semiconductor light source emits light with a luminance that corresponds to an average value $I_{REF}$ of the peak value $I_{PEAK}$ and the bottom value $I_{BOTTOM}$ (that correspond to the two threshold signals $V_{THH}$ and $V_{THL}$).

The present inventors have investigated a case in which the hysteresis control lighting circuit supports a PWM dimming (PWM illumination reducing) function. That is to say, a PWM dimming pulse $S_{PWM}$ is generated with a frequency that is lower than that of the control pulse $S_{CNT}$. When the PWM dimming pulse $S_{PWM}$ is set to a first level (e.g., high level) that indicates an on period, the switching transistor M1 is turned on. When the PWM dimming pulse is set to a second level (e.g., low level) that indicates an off period, the switching transistor M1 is turned off. By changing the duty ratio of the PWM dimming pulse $S_{PWM}$, this arrangement is capable of changing the effective luminance of the semiconductor light source 10.

FIG. 2 is a diagram for explaining a PWM dimming control operation employed in an automotive lamp 1r shown in FIG. 1. It should be noted that the vertical axis and the horizontal axis shown in the waveform diagrams and the time charts in the present specification are expanded or reduced as appropriate for ease of understanding. Also, each waveform shown in the drawing is simplified or exaggerated for emphasis or ease of understanding.

When the PWM dimming pulse $S_{PWM}$ transits to the high level, and accordingly, the on/off operation transits to the on period, the switching transistor M1 is turned on. The lamp current $I_{LAMP}$ rises with a slope represented by $(V_{IN}-V_{OUT})/L$. When the lamp current $I_{LAMP}$ reaches the upper limit $I_{PEAK}$, the switching transistor M1 is turned off. Subsequently, during the on period, the lamp current $I_{LAMP}$ reciprocates between the peak value $I_{PEAK}$ and the bottom value $I_{BOTTOM}$.

Subsequently, the PWM dimming pulse $S_{PWM}$ transits to the low level, and accordingly, the on/off operation transits to the off period. In this stage, the switching transistor M1 is turned off. In this state, the lamp current $I_{LAMP}$ falls to zero with a slope represented by ($V_{OUT}$/L).

With the hysteresis control operation, the lamp current $I_{LAMP}$ changes at a very high speed when switching between the on period and the off period. This is one of the advantages of employing the hysteresis control operation. However, such a rapid change in the lamp current $I_{LAMP}$ in the switching between the on period and the off period has the potential to cause electromagnetic noise depending on the inductance of the inductor L1 or a combination of the input voltage $V_{IN}$ and the output voltage $V_{OUT}$.

SUMMARY OF THE INVENTION

The present invention has been made in order to solve such a problem. Accordingly, it is an exemplary purpose of an embodiment of the present invention to provide an automotive lamp and a lighting circuit configured to suppress electromagnetic noise.

An embodiment of the present invention relates to a lighting circuit employed for an automotive lamp. The lighting circuit comprises: a switching converter structured to supply electric power to a semiconductor light source provided to the automotive lamp; and a converter controller structured to control the switching converter. The converter controller comprises: a hysteresis comparator structured to compare a current detection signal that corresponds to a driving current supplied from the switching converter to the semiconductor light source with an upper-side threshold signal and a lower-side threshold signal determined according to a reference signal, and to generate a control pulse that corresponds to a comparison result; a driver structured to drive a switching transistor of the switching converter according to the control pulse; and a PWM dimming circuit structured to generate a gradual change signal by changing a PWM (pulse width modulation) dimming signal so as to have a dulled waveform, and to change the reference signal based on the gradual change signal.

With such an embodiment, by gradually changing an envelope curve of the lamp current, this arrangement is capable of suppressing electromagnetic noise accompanying the PWM dimming control operation.

Also, the PWM dimming circuit may comprise a low-pass filter (integrating circuit) structured to receive the PWM dimming signal, and to generate the gradual change signal. This arrangement is capable of adjusting the amount of electromagnetic noise and the linearity of the PWM dimming control operation according to the cutoff frequency (time constant) of the low-pass filter.

Also, the hysteresis comparator may comprise: a comparator structured to compare the current detection signal with a threshold voltage, and to generate the control pulse; a first resistor, a transistor, and a second resistor sequentially arranged in series between a line at which the analog dimming signal is supplied and a ground; and a selector structured to receive a first voltage that occurs at a connection node that couples the first resistor and the transistor and a second voltage that occurs at a connection node that couples the transistor and the second resistor, and to output one from among the first voltage and the second voltage according to the control pulse. Also, the threshold voltage may correspond to an output voltage of the selector.

The lighting circuit according to an embodiment may further comprise: a frequency detection circuit structured to generate a frequency detection signal that indicates a frequency of the control pulse; and a threshold voltage adjustment circuit structured to change a voltage difference between the upper-side threshold signal and the lower-side threshold signal such that the frequency detection signal approaches a reference value. With this embodiment, the switching frequency can be stabilized to a frequency that corresponds to the reference value regardless of input voltage variation, output voltage variation, and inductance variation.

The lighting circuit according to an embodiment may further comprise a modulator structured to generate a modulation signal having a frequency that is lower than a switching frequency of the switching transistor, and to modulate a difference between the upper-side threshold signal and the lower-side threshold signal according to the modulation signal. With this embodiment, such an arrangement is capable of providing the switching frequency with a sufficiently wide spectrum. This arrangement is capable of suppressing the occurrence of beat noise, etc.

Another embodiment of the present invention relates to an automotive lamp. The automotive lamp comprises: a semiconductor light source; and any one of the lighting circuits described above, structured to light the semiconductor light source.

It should be noted that any combination of the components described above, any component of the present invention, or any manifestation thereof, may be mutually substituted between a method, apparatus, system, and so forth, which are also effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
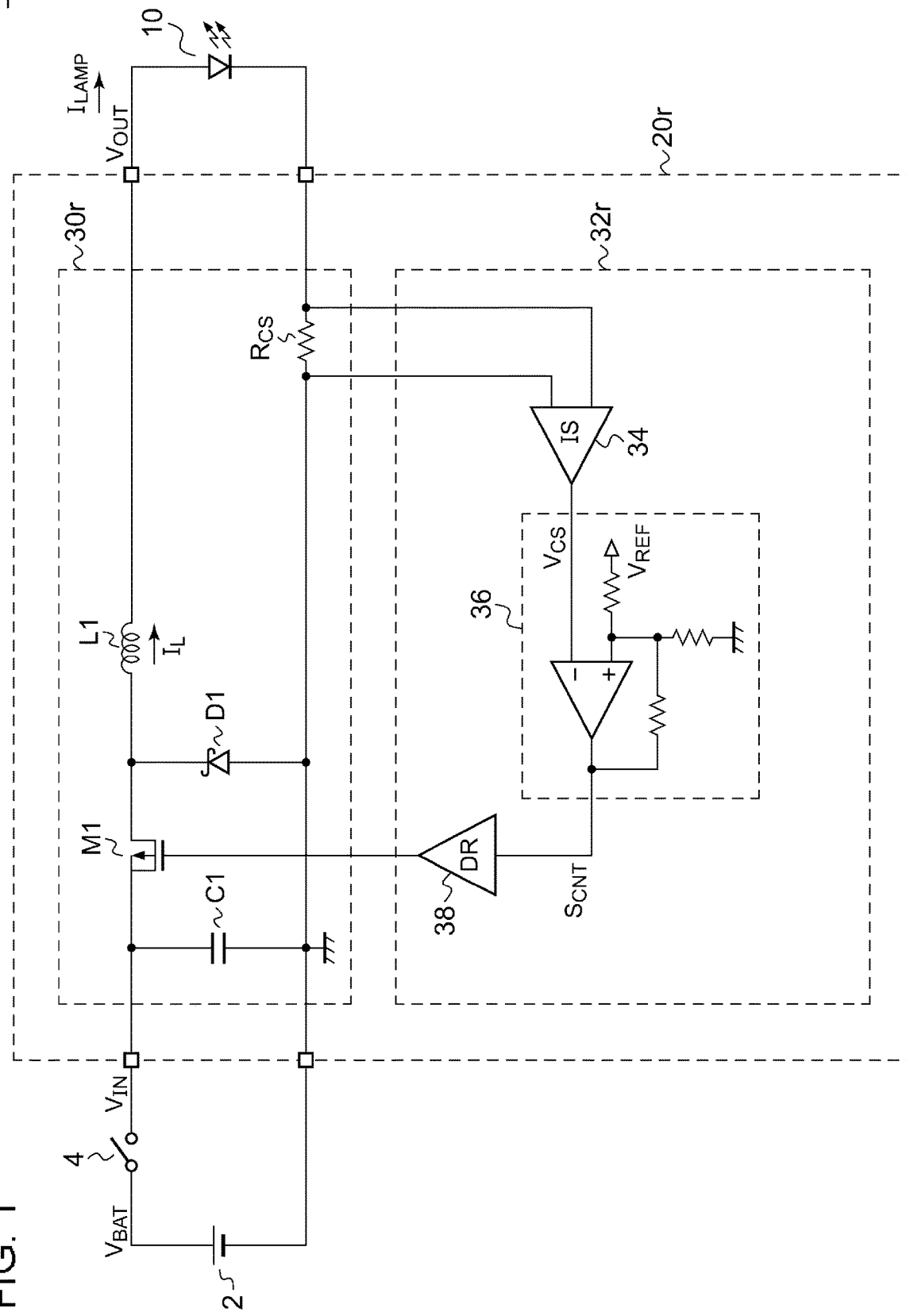
FIG. 1 is a block diagram showing an automotive lamp employing a hysteresis control operation investigated by the present inventors.
Figure 2:
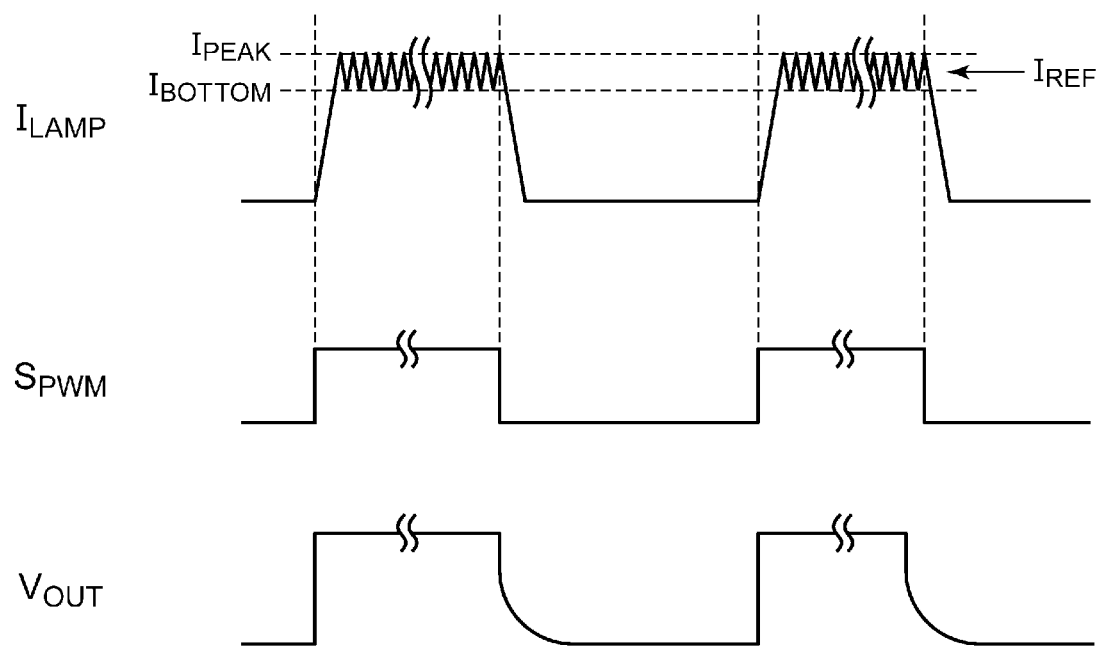
FIG. 2 is a diagram for explaining a PWM dimming control operation of the automotive lamp shown in FIG. 1.

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

In the present specification, the reference symbols denoting electric signals such as a voltage signal, current signal, or the like, and the reference symbols denoting circuit elements such as a resistor, capacitor, or the like, also represent the corresponding voltage value, current value, resistance value, or capacitance value as necessary.

First Embodiment

Figure 3:
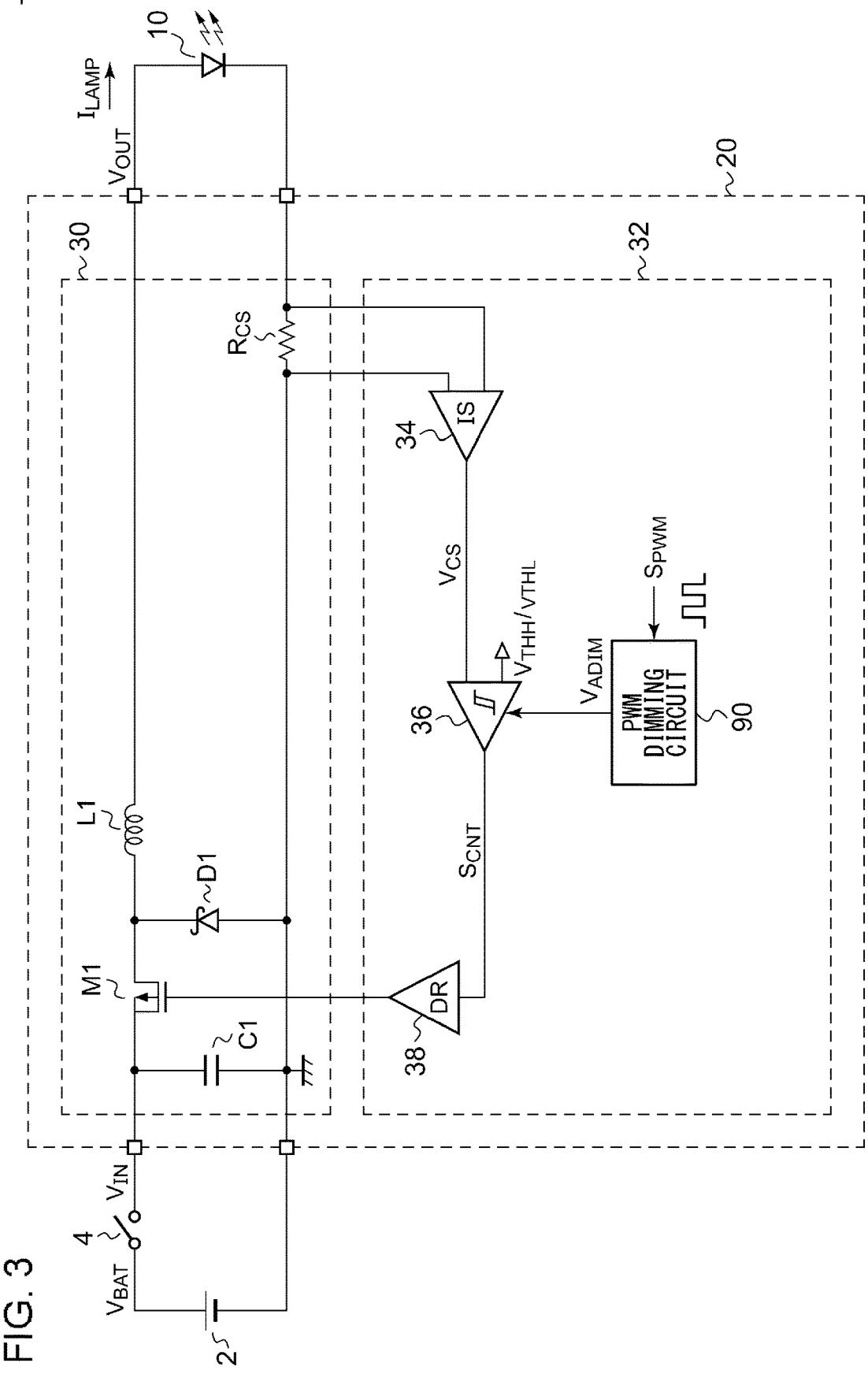
FIG. 3 is a block diagram showing an automotive lamp according to a first embodiment.

FIG. 3 is a block diagram showing an automotive lamp 1 according to a first embodiment. The automotive lamp 1 includes a semiconductor light source 10 and a lighting circuit 20. Examples of the semiconductor light source 10 include LEDs, LDs, organic EL (electroluminescence), and the like. However, the semiconductor light source 10 is not restricted in particular. The lighting circuit 20 includes a switching converter 30 and a converter controller 32. As with the arrangement shown in FIG. 1, the switching converter 30 is configured as a step-down converter. The converter controller 32 stabilizes the lamp current $I_{LAMP}$, which is supplied from the switching converter 30 to the semiconductor light source 10, to a predetermined target current $I_{REF}$.

The converter controller 32 includes a current detection circuit 34, a hysteresis comparator 36, a driver 38, and a PWM dimming circuit 90. The current detection circuit 34 generates a current detection signal $V_{CS}$ that corresponds to the lamp current $I_{LAMP}$ supplied from the switching converter 30 to the semiconductor light source 10. As with the arrangement shown in FIG. 1, a sensing resistor $R_{CS}$ may be arranged on a path of the lamp current $I_{LAMP}$. The current detection circuit 34 may amplify a voltage drop that occurs across the sensing resistor $R_{CS}$ so as to generate the current detection signal $V_{CS}$.

The hysteresis comparator 36 compares the current detection signal $V_{CS}$ with an upper-side threshold signal $V_{THH}$ and a lower-side threshold signal $V_{THL}$, and generates a control pulse $S_{CNT}$ that corresponds to the comparison result. The upper-side threshold signal $V_{THH}$ and the lower-side threshold signal $V_{THL}$ are each determined according to an analog dimming signal $V_{ADIM}$.

The driver 38 drives a switching transistor M1 of the switching converter 30 according to the control pulse $S_{CNT}$. In the present embodiment, the high level of the control pulse $S_{CNT}$ corresponds to the on state of the switching transistor M1. The low level of the control pulse $S_{CNT}$ corresponds to the off state of the switching transistor M1.

A PWM dimming signal $S_{PWM}$ is input to the lighting circuit 20. The PWM dimming signal $S_{PWM}$ has a frequency on the order of several dozen Hz to several hundred Hz, and has a duty ratio that is changed according to the target luminance of the semiconductor light source 10.

The PWM dimming circuit 90 processes the PWM dimming signal $S_{PWM}$ so as to generate a gradual change signal $S_{SOFT}$ having a dulled waveform. The PWM dimming circuit 90 changes the analog dimming signal $V_{ADIM}$ according to the gradual change signal $S_{SOFT}$.

Figure 4:
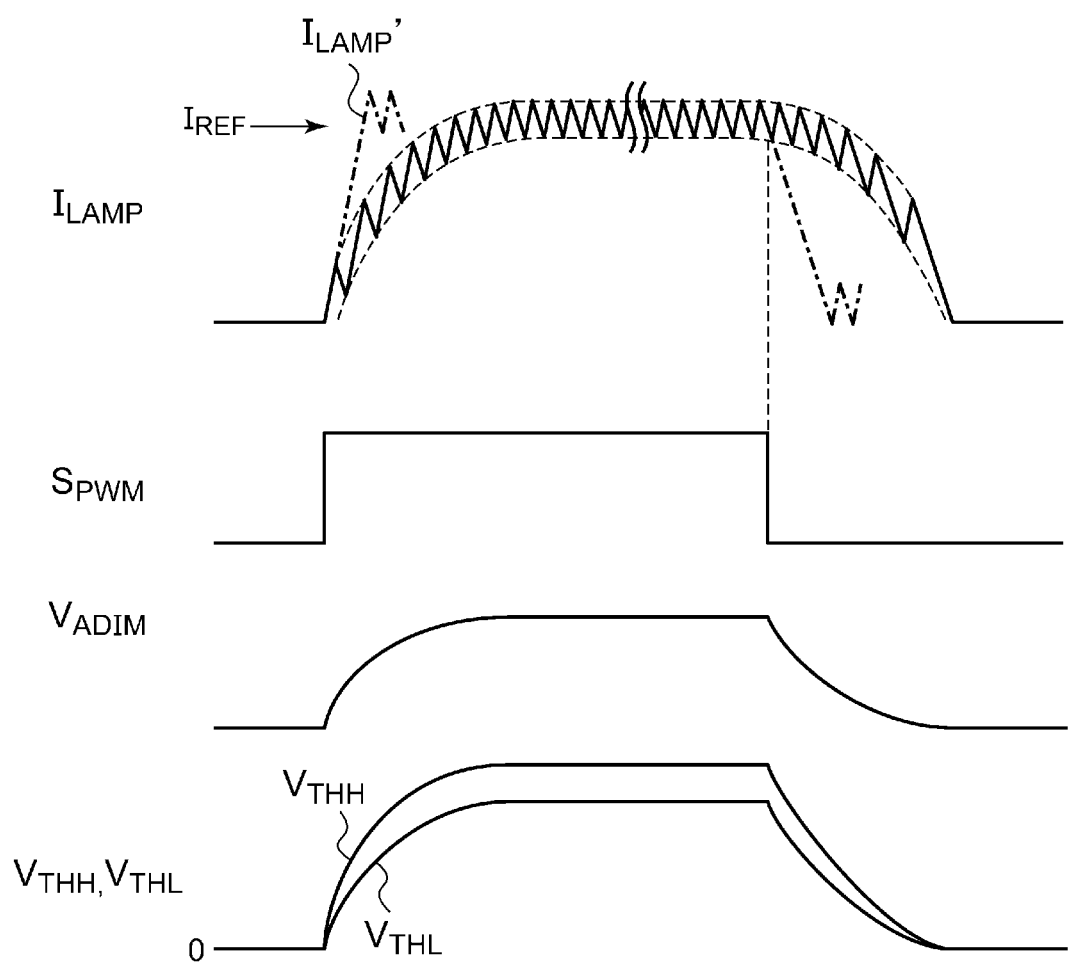
FIG. 4 is an operation waveform diagram showing the operation of a lighting circuit shown in FIG. 3.

The above is the configuration of the automotive lamp 1. Next, description will be made regarding the operation thereof. FIG. 4 is an operation waveform diagram showing the operation of the lighting circuit 20 shown in FIG. 3. The analog dimming signal $V_{ADIM}$ has a waveform that corresponds to the gradual change signal obtained by dulling the waveform of the PWM dimming signal $S_{PWM}$. When the PWM dimming signal $S_{WPM}$ transits from the low level to the high level, and accordingly, the on/off operation transits to the on period, the upper-side threshold signal $V_{THH}$ and the lower-side threshold signal $V_{THL}$ to be employed in the hysteresis comparator 36 each gradually rise according to the analog dimming signal $V_{ADIM}$. Accordingly, the current detection signal $V_{CS}$ and an envelope curve of the lamp current $I_{LAMP}$ gradually rise according to the analog dimming signal $V_{ADIM}$.

Conversely, when the PWM dimming signal $S_{PWM}$ transits from the high level to the low level, and accordingly, the on/off operation transits to the off period, the upper-side threshold signal $V_{THH}$ and the lower-side threshold signal $V_{THL}$ to be employed in the hysteresis comparator 36 each gradually drop according to the analog dimming signal $V_{ADIM}$. Accordingly, the current detection signal $V_{CS}$ and an envelope curve of the lamp current $I_{LAMP}$ gradually drop according to the analog dimming signal $V_{ADIM}$.

The above is the operation of the lighting circuit 20. As a comparison, in FIG. 4, the waveform of the lamp current $I_{LAMP}'$ shown in FIG. 1 is indicated by the line of alternately long and short dashes. With such an operation indicated by the line of alternately long and short dashes, when the PWM dimming signal $S_{PWM}$ transits to the high level, the lamp current $I_{LAMP}$ immediately rises up to a value in the vicinity of the target current $I_{REF}$. The sharp change in current in this stage causes electromagnetic noise. In contrast, with the lighting circuit 20 shown in FIG. 3, the lamp current $I_{LAMP}$ has the same slope as that of the lamp current $I_{LAMP}'$. However, the change in the lamp current $I_{LAMP}$ for every switching is reduced, thereby suppressing the occurrence of electromagnetic noise.

The present invention encompasses various kinds of apparatuses and circuits that can be regarded as a block configuration or a circuit configuration shown in FIG. 3, or otherwise that can be derived from the aforementioned description. That is to say, the present invention is not restricted to a specific configuration. More specific description will be made below regarding an example configuration for clarification and ease of understanding of the essence of the present invention and the circuit operation. That is to say, the following description will by no means be intended to restrict the technical scope of the present invention.

Figure 5:
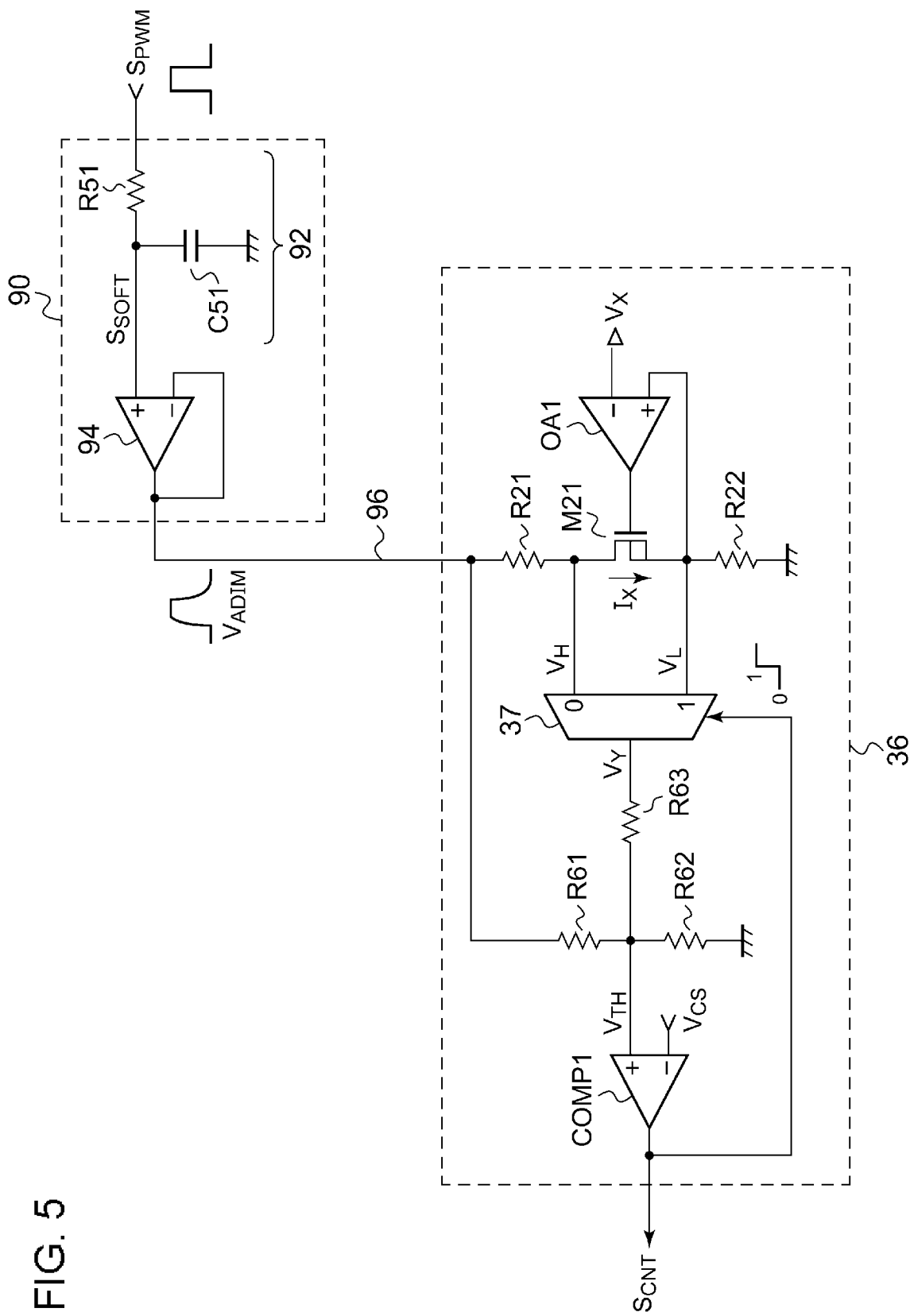
FIG. 5 is a circuit diagram showing a part of an example configuration of the lighting circuit shown in FIG. 3.

FIG. 5 is a circuit diagram showing a part of an example configuration of the lighting circuit 20 shown in FIG. 3. The PWM dimming circuit 90 includes a low-pass filter 92 and a buffer 94. The low-pass filter 92 is configured as a primary RC filter including a resistor R51 and a capacitor C51. The output signal of the low-pass filter 92 corresponds to the gradual change signal described above. The buffer 94 receives the gradual change signal, and outputs the gradual change signal thus received as an analog dimming signal $V_{ADIM}$. Instead of the buffer 94, a non-inverting amplifier may be employed.

In a case in which the analog dimming signal $V_{ADIM}$ is designed to have an excessively gentle waveform, this reduces the electromagnetic noise. However, such an arrangement has a problem of degraded linearity of the luminance with respect to the duty ratio in a range in which the PWM dimming signal $S_{PWM}$ has a small duty ratio. Conversely, in a case in which the analog dimming signal $V_{ADIM}$ is designed to have an excessively steep waveform, this provides improved linearity of the luminance with respect to the duty ratio. However, such an arrangement has a problem of increased electromagnetic noise. With the PWM dimming circuit 90 shown in FIG. 5, this arrangement is capable of setting a balance between the electromagnetic noise reduction effect and the linearity of the PWM dimming control operation based on the cutoff frequency of the low-pass filter 92.

The hysteresis comparator 36 includes a comparator COMP1, a first resistor R21, a second resistor R22, a first transistor M21, a selector 37, and resistors R61 through R63. The comparator COMP1 compares the current detection signal $V_{CS}$ with a threshold voltage $V_{TH}$, and generates the control pulse $S_{CNT}$. The first resistor R21, the first transistor M21, and the second resistor R22 are sequentially arranged in series between the line at which the analog dimming signal $V_{ADIM}$ is supplied and the ground.

The gate of the first transistor M21 is biased as appropriate. For example, in order to bias the first transistor M21, an operational amplifier OA1 is provided. The output of the operational amplifier OA1 is coupled to the gate of the first transistor M21. The non-inverting input terminal of the operational amplifier OA1 is coupled to a connection node that couples the transistor M21 and the second resistor R22. A given voltage $V_X$ is input to the inverting input terminal of the operational amplifier OA1. With this configuration, the first transistor M21 is biased such that the current $I_X = V_X/R22$ flows in proportion to the voltage $V_X$. In this case, the two voltages $V_H$ and $V_L$ are represented by the following Expressions.

$$V_H = V_{ADIM} - V_X \times R21 \quad (1a)$$

$$V_L = I_X \times R22 \quad (1b)$$

In a case in which R21=R22=R, the following Expressions hold true.

$$V_H = V_{ADIM} - V_X \times R \quad (2a)$$

$$V_L = I_X \times R \quad (2b)$$

In this case, the average voltage is represented by the following Expression (3).

$$(V_H + V_L)/2 = V_{ADIM}/2 \quad (3)$$

That is to say, the average value of the lamp current $I_{LAMP}$ ($I_{REF}$) can be controlled based on the analog dimming voltage $V_{ADIM}$.

The selector 37 receives a first voltage $V_H$ that occurs at a connection node that couples the first resistor R21 and the first transistor M21 and a second voltage $V_L$ that occurs at a connection node that couples the first transistor M21 and the second resistor R22, and outputs one from among the first voltage $V_H$ and the second voltage $V_L$ according to the control pulse $S_{CNT}$.

The threshold voltage $V_{TH}$ to be supplied to the comparator COMP1 corresponds to the output voltage $V_Y$ of the selector 37. For example, the threshold voltage $V_{TH}$ may be generated as a weighted average of the voltage $V_Y$ and the analog dimming signal $V_{ADIM}$ generated by means of the resistors R61 through R63. Alternatively, the voltage $V_Y$ itself may be employed as the threshold voltage $V_{TH}$.

Second Embodiment

Figure 6:
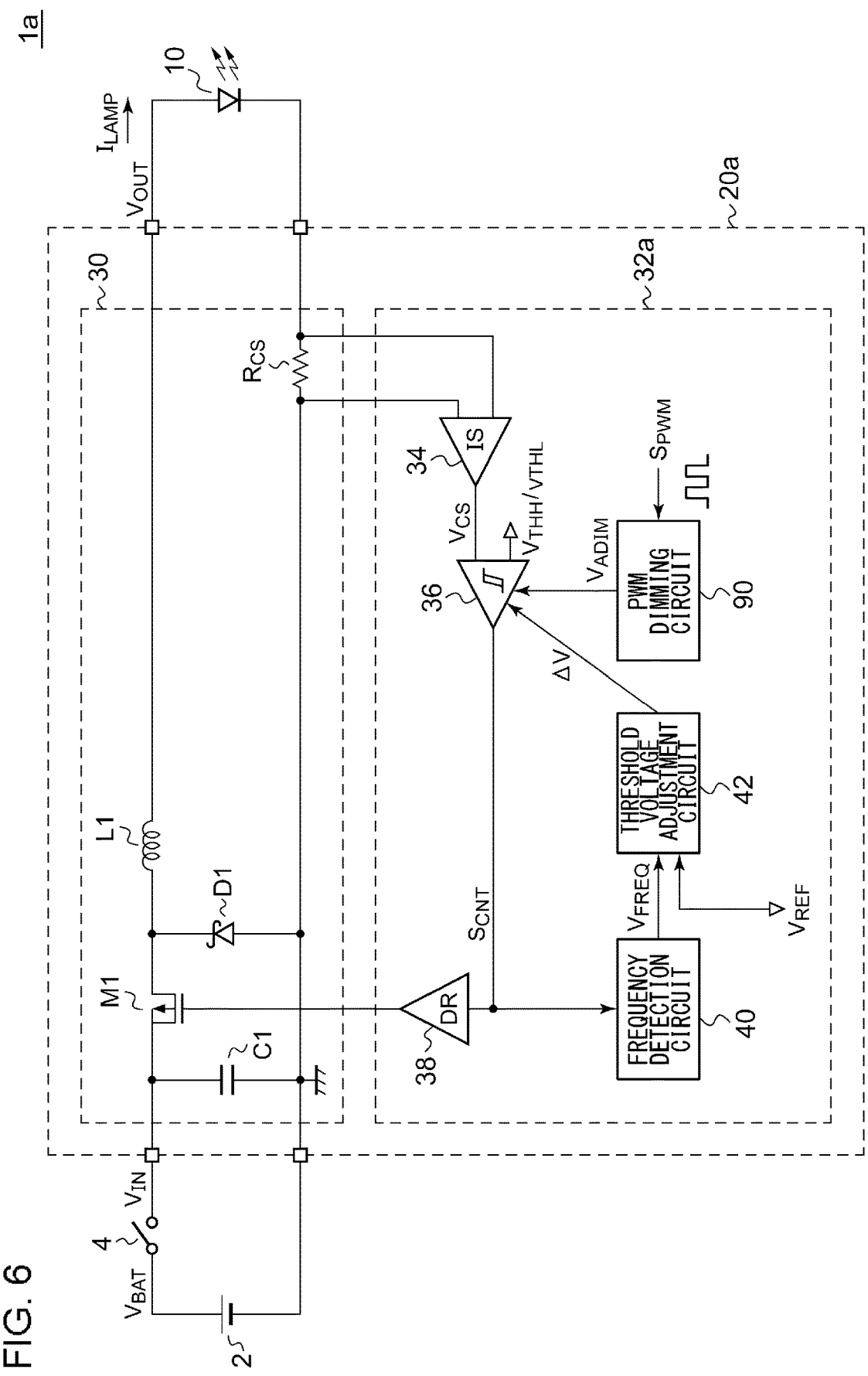
FIG. 6 is a block diagram showing an automotive lamp according to a second embodiment.

FIG. 6 is a block diagram showing an automotive lamp 1a according to a second embodiment. A converter controller 32a shown in FIG. 6 further includes a frequency detection circuit 40 and a threshold voltage adjustment circuit 42 in addition to the converter controller 32 shown in FIG. 3.

The frequency detection circuit 40 generates a frequency detection signal $V_{FREQ}$ that indicates the frequency of the control pulse $S_{CNT}$, i.e., the switching frequency of the switching transistor M1. The threshold voltage adjustment circuit 42 changes the voltage difference (hysteresis width) $\Delta V$ ($=V_{THH} - V_{THL}$) between the upper-side threshold signal $V_{THH}$ and the lower-side threshold voltage $V_{THL}$ such that the frequency detection signal $V_{FREQ}$ approaches a reference value $V_{REF}$.

With the second embodiment, this arrangement is capable of stabilizing the switching frequency to a frequency that corresponds to the reference value $V_{REF}$ regardless of the change in the input voltage $V_{IN}$, in the output voltage $V_{OUT}$, and in the inductance L1.

Figure 7:
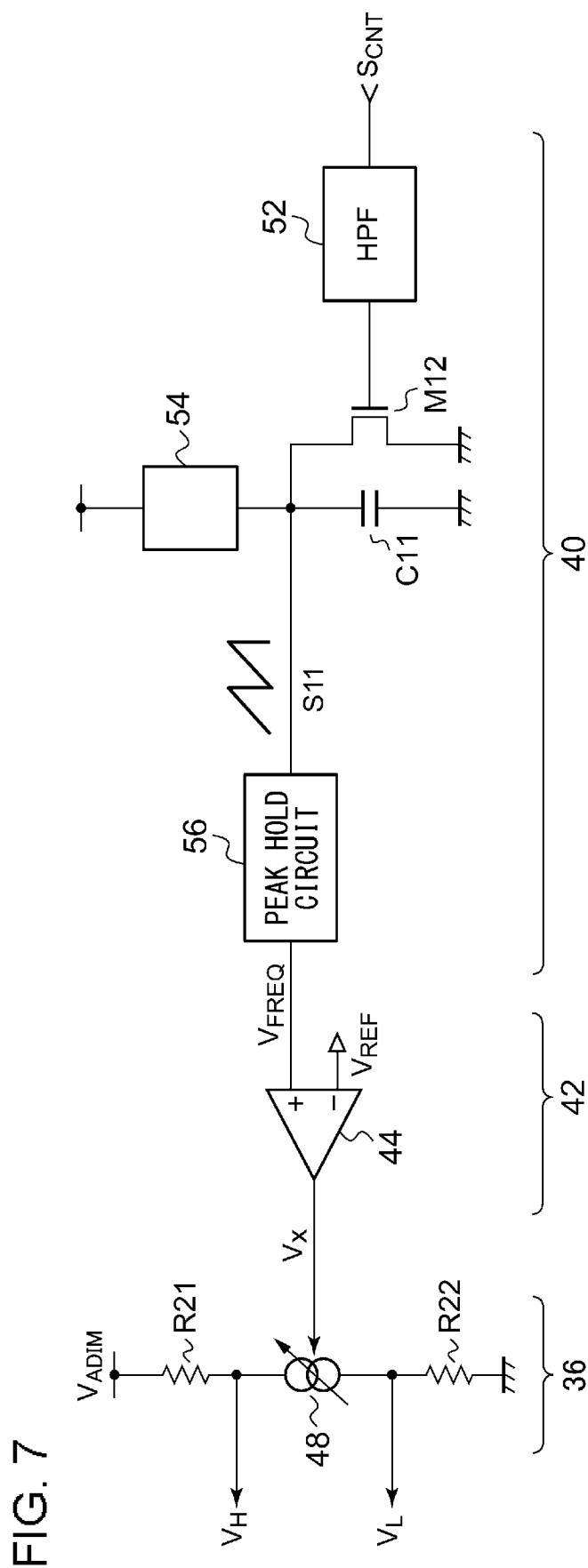
FIG. 7 is a circuit diagram showing an example configuration of a lighting circuit shown in FIG. 6.

Next, specific description will be made regarding an example configuration of the second embodiment. FIG. 7 is a circuit diagram showing an example configuration of the lighting circuit 20a shown in FIG. 6. FIG. 7 shows the frequency detection circuit 40, the threshold voltage adjustment circuit 42, and a part of the hysteresis comparator 36.

The frequency detection circuit 40 can be regarded as a F/V conversion circuit. The frequency detection circuit 40 includes a high-pass filter 52, a first capacitor C11, a second transistor M12, a charger circuit 54, and a peak hold circuit 56. The high-pass filter 52 receives the control pulse $S_{CNT}$ or otherwise a gate pulse of the switching transistor M1. The high-pass filter 52 can also be regarded as a differentiating circuit. One end of the first capacitor C11 is grounded. The charger circuit 54 charges the first capacitor C11. The charger circuit 54 is configured as a current source or otherwise a resistor. The second transistor M12 is coupled in parallel with the first capacitor C11. When the output signal of the high-pass filter 52 exceeds the gate-source threshold voltage of the second transistor M12, the first capacitor C11 is discharged.

A first periodic signal S11 having a ramp waveform is generated at the first capacitor C11. The frequency detection circuit 40 outputs the frequency detection signal $V_{FREQ}$ that corresponds to the amplitude of the first periodic signal S11. Specifically, the peak hold circuit 56 receives the first periodic signal S11, and outputs the frequency detection signal $V_{FREQ}$ that indicates the peak value of the first periodic signal S11.

As described above, with the hysteresis comparator 36 shown in FIG. 5, the two voltages $V_H$ and $V_L$ are represented by Expressions (2a) and (2b). Accordingly, the voltage difference between them is represented by the following Expression (4).

$$V_H - V_L = V_{ADIM} - 2 \times I_X \times R = V_{ADIM} - 2 \times V_X \quad (4)$$

Accordingly, by changing the voltage $V_X$, this arrangement is capable of changing the voltage difference ($V_H-V_L$), thereby allowing the hysteresis width $\Delta V$ to be changed.

Accordingly, the threshold voltage adjustment circuit 42 changes the voltage $V_X$ such that the frequency detection signal $V_{FREQ}$ approaches the reference value $V_{REF}$. For example, the threshold voltage adjustment circuit 42 may generate the voltage $V_X$ based on the difference between the frequency detection signal $V_{FREQ}$ and the reference value $V_{REF}$. The threshold voltage adjustment circuit 42 may include a voltage comparator that compares the frequency detection signal $V_{FREQ}$ with the reference value $V_{REF}$, and a low-pass filter that smooths the output pulse of the voltage comparator. Alternatively, the threshold voltage adjustment circuit 42 may include an error amplifier that amplifies the difference between the frequency detection signal $V_{FREQ}$ and the reference value $V_{REF}$.

Description will be made regarding the operation of the circuit shown in FIG. 7. When the switching frequency of the switching transistor M1 is higher than the target frequency, the relation $V_{FREQ}<V_{REF}$ holds true, which lowers the voltage $V_X$. This raises the voltage difference between the upper-side voltage $V_H$ and the lower-side voltage $V_L$, i.e., raises the voltage difference $\Delta V$ between the threshold voltages $V_{THH}$ and $V_{THL}$. This provides a feedback operation so as to lower the switching frequency, i.e., such that the switching frequency approaches the target frequency.

Conversely, when the switching frequency of the switching transistor M1 is lower than the target frequency, the relation $V_{FREQ}>V_{REF}$ holds true, which raises the voltage $V_X$. This lowers the voltage difference between the upper-side voltage $V_H$ and the lower-side voltage $V_L$. This provides a feedback operation so as to raise the switching frequency, i.e., such that the switching frequency approaches the target frequency. As described above, with the lighting circuit 20, this arrangement is capable of stabilizing the switching frequency to the target frequency.

The frequency feedback control operation functions as an effective measure against fluctuation in the switching frequency due to all kinds of fluctuation and variation such as fluctuation of the output voltage $V_{OUT}$, variation in the inductance of the inductor L1, and fluctuation in the temperature, in addition to fluctuation of the input voltage $V_{IN}$. This is capable of suppressing unexpected fluctuation in the switching frequency. This allows the costs required for a measure against switching noise to be reduced.

Furthermore, the average level of the upper-side threshold signal $V_{THH}$ and the lower-side threshold signal $V_{THL}$ depends on only the analog dimming signal $V_{ADIM}$. That is to say, the average level does not depend on the hysteresis width $V_X$. Accordingly, this arrangement is capable of maintaining the average value of the lamp current $I_{LAMP}$ while changing the hysteresis width $\Delta V$. This is capable of preventing the occurrence of flicker in the semiconductor light source 10.

Third Embodiment

Figure 8:
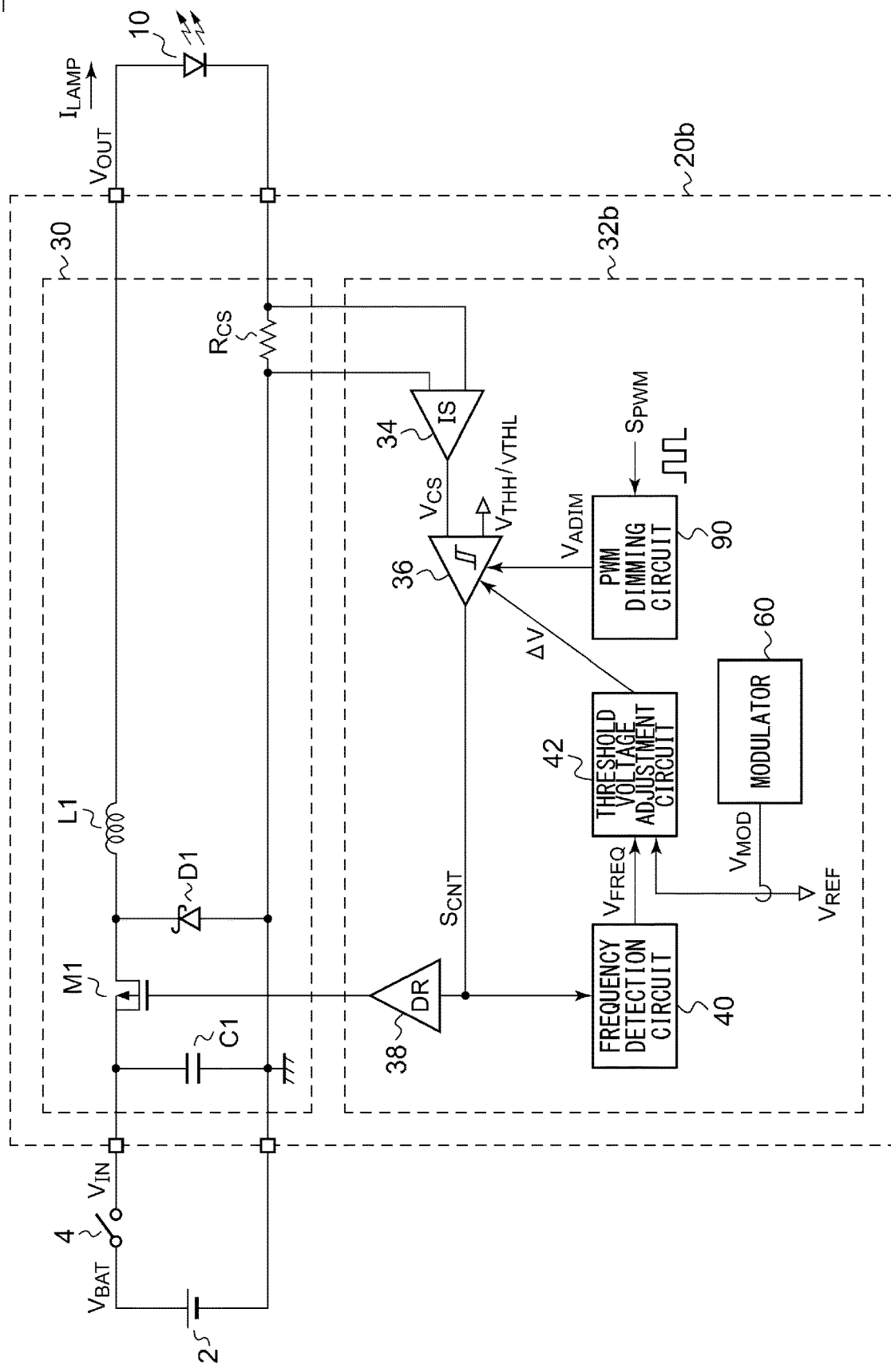
FIG. 8 is a block diagram showing an automotive lamp according to a third embodiment.

FIG. 8 is a block diagram showing an automotive lamp 1b according to a third embodiment. A converter controller 32b shown in FIG. 8 further includes a modulator 60 in addition to the converter controller 32a shown in FIG. 6. The modulator 60 generates a modulation signal $V_{MOD}$ having a frequency that is lower than the switching frequency of the switching transistor M1, and modulates the difference (hysteresis width) between the upper-side threshold signal $V_{THH}$ and the lower-side threshold signal $V_{THL}$ according to the modulation signal $V_{MOD}$. For example, the modulator 60 may superimpose the modulation signal $V_{MOD}$ on the reference value $V_{REF}$ to be input to the threshold voltage adjustment circuit 42.

Figure 9:
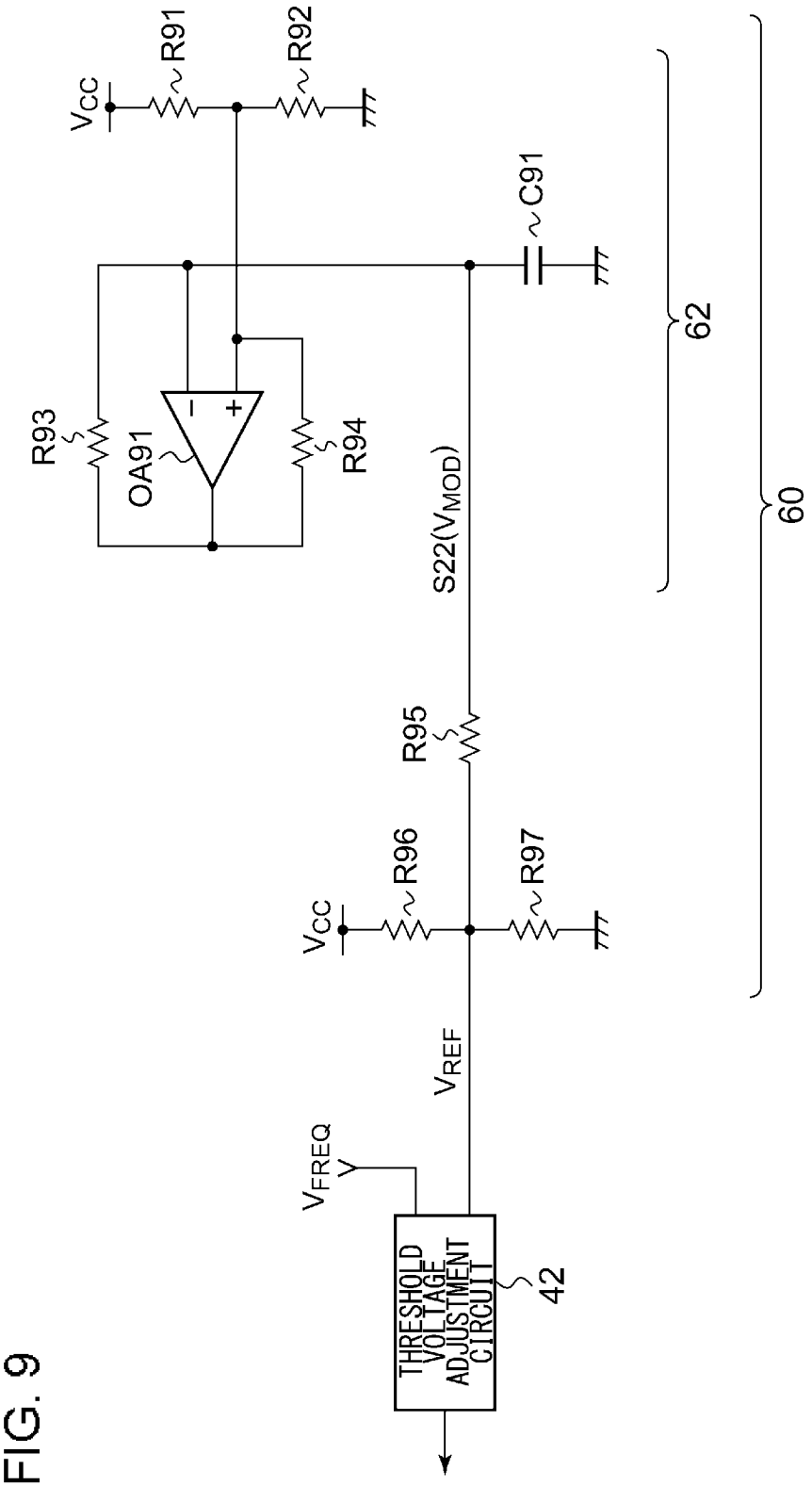
FIG. 9 is a circuit diagram showing an example configuration of a modulator.

FIG. 9 is a circuit diagram showing an example configuration of the modulator 60. The modulator 60 includes an oscillator 62 that generates a modulation signal $V_{MOD}$ having a frequency that is sufficiently lower than the switching frequency. The modulator 60 changes the reference value $V_{REF}$ according to the modulation signal $V_{MOD}$. The oscillator 62 includes resistors R91 through R94, a capacitor C91, and an operational amplifier OA91. A triangle-wave modulation signal $V_{MOD}$ is generated at the capacitor C91 with the voltage level determined by the resistors R91 and R92 as a reference voltage.

It should be noted that the waveform of the modulation signal $V_{MOD}$ is not restricted in particular. Also, the modulation signal $V_{MOD}$ may be designed to be any one from among a sawtooth wave, a ramp wave, a sine wave, and a trapezoidal wave. From a different viewpoint, the modulation signal $V_{MOD}$ may preferably be configured as a periodic signal having a slope. The modulation signal $V_{MOD}$ and the power supply voltage $V_{CC}$ are subjected to weighted averaging (weighted addition) by means of the resistors R95 through R97, thereby generating the reference value $V_{REF}$ on which the modulation signal $V_{MOD}$ has been superimposed.

With the third embodiment, the switching frequency is feedback controlled such that the actual switching frequency approaches the target frequency, while slowly changing the target frequency of the switching frequency according to the modulation signal $V_{MOD}$. This arrangement is capable of removing the effects of fluctuation of the input voltage $V_{IN}$ or the output voltage $V_{OUT}$, variation in the inductance, fluctuation in the temperature, etc., and of providing the switching frequency with a sufficiently wide spectrum. This arrangement is capable of suppressing the occurrence of beat noise, etc.

It should be noted that, with the third embodiment, the requested function of the modulator 60 is a function of modulating the difference $\Delta V$ between the upper-side threshold signal $V_{THH}$ and the lower-side threshold signal $V_{THL}$ according to the modulation signal $V_{MOD}$. Accordingly, the modulator 60 may superimpose the modulation signal $V_{MOD}$ on the frequency detection signal $V_{FREQ}$ instead of the reference value $V_{REF}$.

Fourth Embodiment

Figure 10:
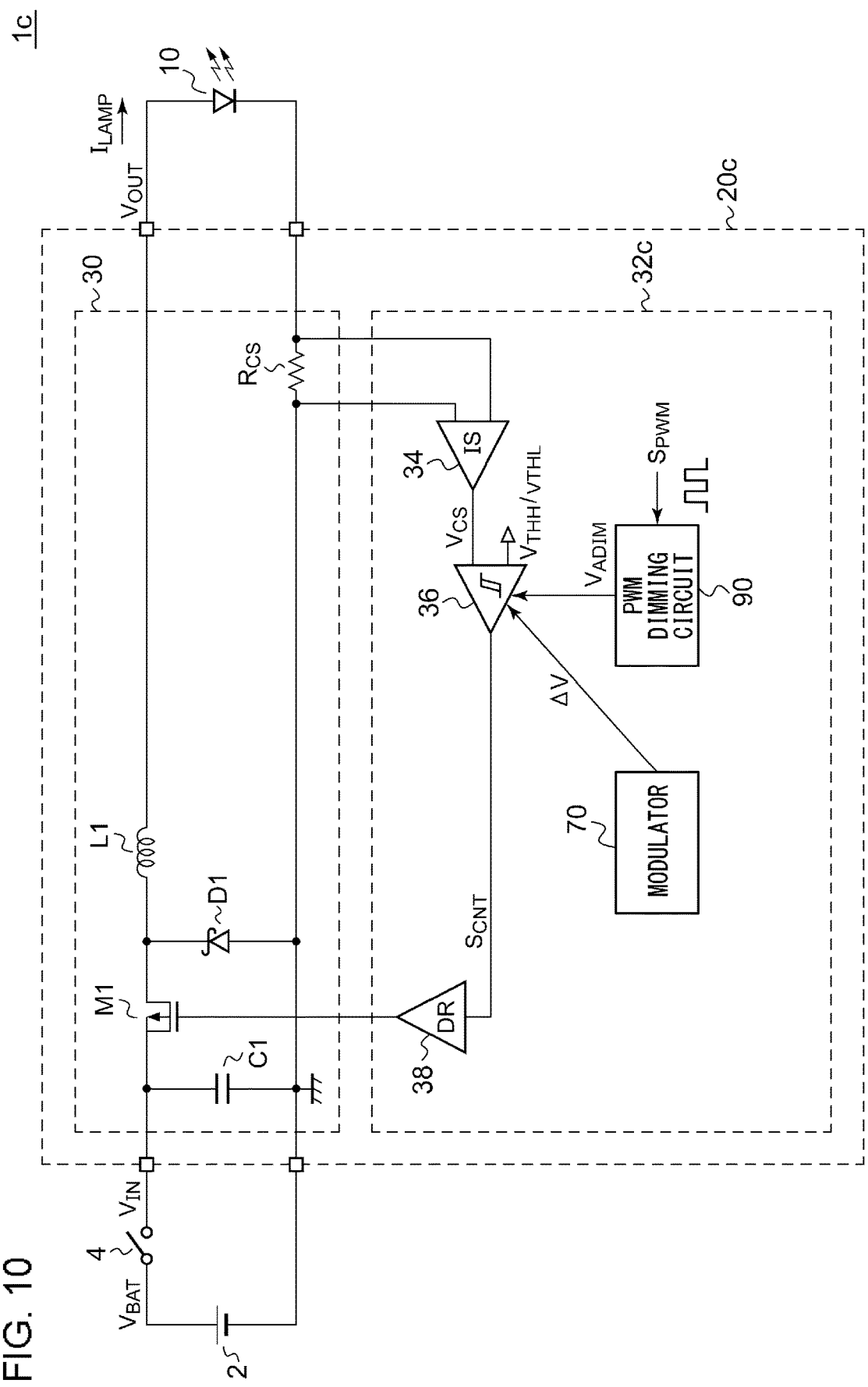
FIG. 10 is a block diagram showing an automotive lamp according to a fourth embodiment.

FIG. 10 is a block diagram showing an automotive lamp 1c according to a fourth embodiment. A converter controller 32c shown in FIG. 10 includes a modulator 70 instead of the converter controller 32 shown in FIG. 3. The modulator 70 generates a modulation signal $V_{MOD}$ having a frequency that is lower than the switching frequency of the switching transistor M1, and modulates the hysteresis width $\Delta V$ according to the modulation signal $V_{MOD}$. The modulator 70 may be configured in the same manner as that of the modulator 60 shown in FIG. 9.

In a case in which the hysteresis comparator 36 has a configuration shown in FIG. 5, the bias state of the transistor M21, i.e., the current $I_X$, may preferably be modulated according to the modulation signal $V_{MOD}$. As described above, the voltage difference between the voltages $V_H$ and $V_L$ is represented by Expression (4). Accordingly, by superimposing the modulation signal $V_{MOD}$ on the voltage $V_X$, this arrangement is capable of modulating the hysteresis width $\Delta V$, and of providing a wide spectrum.

MODIFICATIONS

Next, description will be made regarding modifications that can be applied to several embodiments.

First Modification

Description has been made in several embodiments regarding an arrangement in which the PWM dimming circuit 90, the frequency detection circuit 40, the threshold voltage adjustment circuit 42, the modulator 70, etc., are each configured as an analog circuit. Also, at least a part of or otherwise all the components thereof may be configured as a digital circuit. Furthermore, the overall configuration of the converter controller 32 may be configured based on a digital circuit. In this case, an A/D converter that converts the output signal of the current detection circuit 34 into a digital value may preferably be provided as an additional component, and the hysteresis comparator 36 may be configured as a digital comparator.

Second Modification

The switching converter 30 may be configured as a step-up converter, a step-up/step-down converter, or otherwise a converter employing a transformer. Also, the switching converter 30 may be configured as other kinds of converters such as a Cuk converter or the like.

Usage

Figure 11:
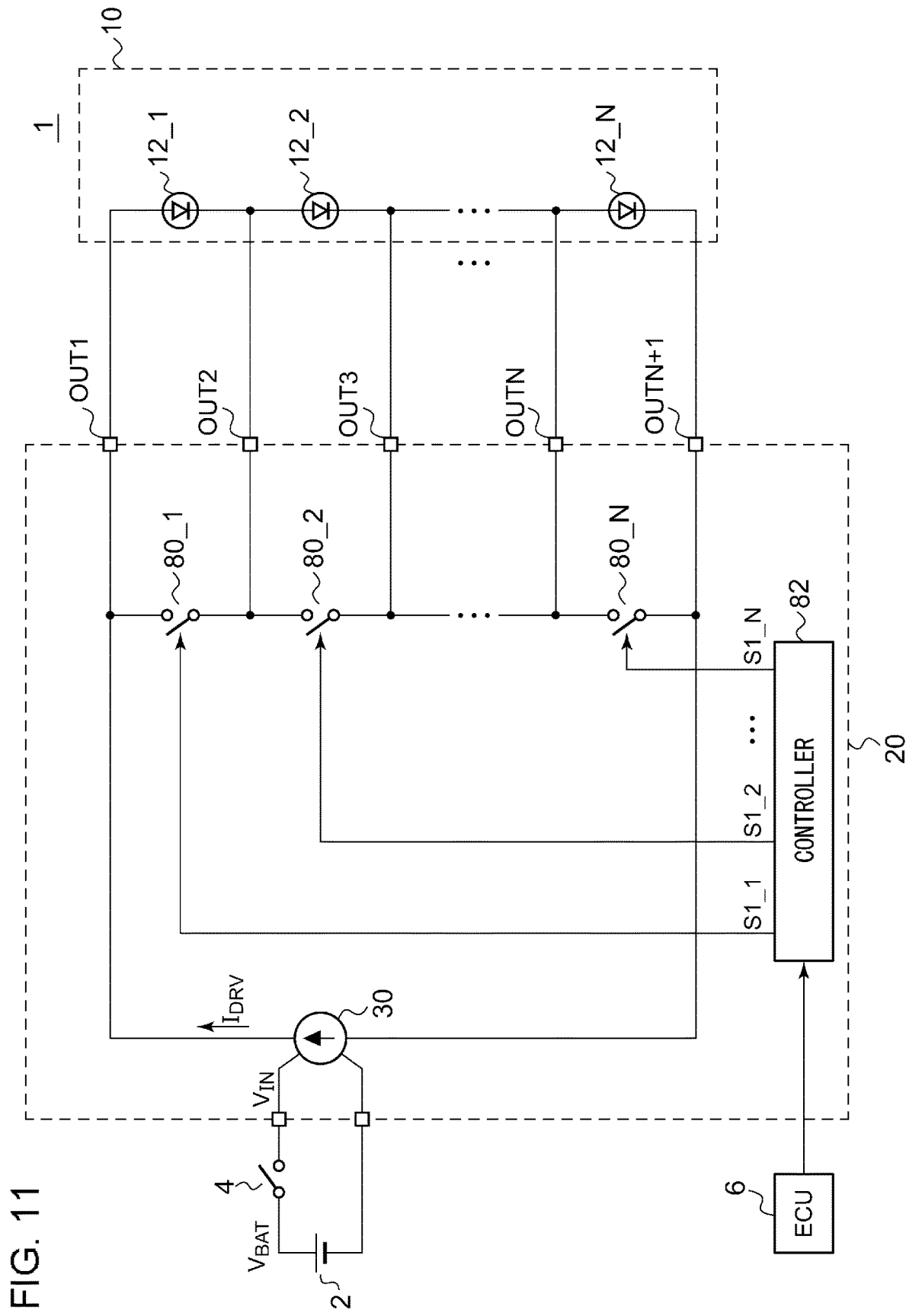
FIG. 11 is a block diagram showing an automotive lamp having an ADB function employing an array method.

FIG. 11 is a block diagram showing the automotive lamp 1 having an ADB function using an array method. In order to support the ADB function, the high-beam illumination region is formed of N (N represents an integer of 2 or more) multiple divided sub regions. The semiconductor light source 10 includes multiple light-emitting devices 12_1 through 12_N associated with the N sub regions. Each light-emitting device 12 is configured as a semiconductor device such as an LED (light-emitting diode), LD (laser diode), or the like. The light-emitting devices 12 are arranged such that they irradiate the corresponding sub regions. The lighting circuit 20 controls the on state (lighting-on state) and the off state (lighting-off state) of each of the multiple light-emitting devices 12_1 through 12_N, so as to change the high-beam light distribution. Alternatively, the lighting circuit 20 PWM (pulse-width modulation) controls the light-emitting devices 12 with a high frequency so as to adjust the effective luminance.

The lighting circuit 20 includes multiple bypass circuits 80_1 through 80_N and a controller 82 in addition to the switching converter 30 and the unshown converter controller 32. The multiple bypass circuits 80_1 through 80_N are associated with the multiple light-emitting devices 12_1 through 12_N. Each bypass circuit 80 is configured to be switchable between the on state and the off state. When the i-th bypass circuit 80_i is set to the on state, the lamp current $I_{lamp}$ flows through the bypass circuit 80_i instead of flowing through the light-emitting device 12_i, which turns off the light-emitting device 12_i. When the bypass circuit 80_i is set to the off state, the lamp current $I_{lamp}$ flows through the light-emitting device 12_i, which turns on the light-emitting device 12_i.

An upstream processor (e.g., electronic control unit ECU) 6 configured to control the automotive lamp 1 determines the sub regions to be irradiated by the high-beam based on the state ahead of the vehicle, and instructs the controller 82 of the lighting circuit 20. The controller 82 controls the states of the bypass circuits 80_1 through 80_N according to a control instruction received from the processor 6. Specifically, the controller 82 selects the light-emitting devices 12 that correspond to the sub regions to be irradiated, and the bypass circuits 80 respectively arranged in parallel with the light-emitting devices 12 thus selected are set to the off state. Furthermore, the bypass circuits 80 respectively arranged in parallel with the remaining light-emitting devices 12 are turned on.

Figure 12:
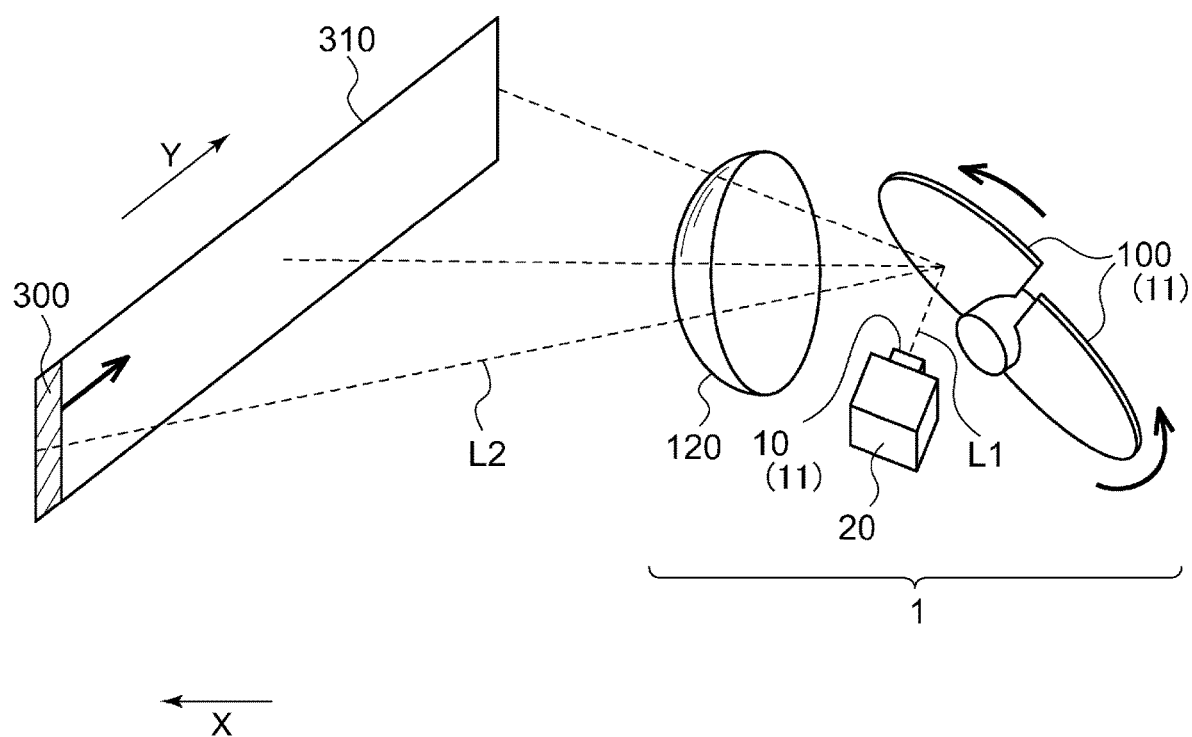
FIG. 12 is a perspective diagram showing a schematic configuration of an automotive lamp having an ADB function employing a blade scanning method.

FIG. 12 is a perspective view showing a schematic configuration of an automotive lamp 1 having an ADB function employing a blade scanning method. The automotive lamp 1 mainly includes a scanning light source 11, a projector lens 120, and a lighting circuit 20.

The scanning light source 11 includes a blade (reflecting mirror) 100, and a light source 10. Multiple light sources 10 may be provided. Here, for ease of understanding and simplicity of description, description will be made regarding an arrangement including a single light source 10.

The light source 10 is configured as a semiconductor light source employing an LED (light-emitting diode) or a laser diode. The blade 100 receives an output light L1 from the light source 10. Furthermore, the blade 100 repeats a predetermined periodic movement so as to scan a reflected light L2 in a forward region ahead of the vehicle along a horizontal direction (Y direction in the drawing). In the present embodiment, the blade 100 is mounted on a rotor of an unshown motor, and is rotationally driven. At a given time point, the output light L1 input to the blade 100 is reflected with a reflection angle that corresponds to the position (rotational angle of the rotor) of the blade 100, thereby forming an illumination region 300.

The blade 100 is rotationally driven so as to change the reflection angle, thereby scanning the illumination region 300 in the Y direction. By repeating this scanning at a high speed, e.g., at a frequency of 50 Hz or more, the light distribution pattern 310 is formed. The lighting circuit 20 controls the light amount (luminance) to be supplied from the light source 10 in synchronization with the periodic movement of the blade 100 so as to obtain a desired light distribution pattern. An area (region) that is provided with the illumination region 300 will be referred to as the "on region $R_{ON}$". Conversely, an area (region) that is not provided with the illumination region 300 will be referred to as the "off region $R_{OFF}$". The light distribution pattern 310 is a combination of the on regions $R_{ON}$ and the off regions $R_{OFF}$.

With the automotive lamp 1 shown in FIG. 12, description will be made regarding an arrangement that generates a light distribution pattern 310 such that a region in which there is a vehicle ahead of the user's vehicle is set to the off region $R_{OFF}$ in order to provide an anti-glare function for such a vehicle ahead of the user's vehicle. In this case, the on/off state of the semiconductor light source 10 is switched in synchronization with the periodic movement of the blade 100. Thus, such an operation can be regarded as a kind of PWM dimming control operation.

The configuration of the scanning light source 11 is not restricted to such an arrangement shown in FIG. 12. For example, instead of the blade 100, a polygon mirror or a mirror galvanometer may be employed. Also, a MEMS (Micro Electro Mechanical System) scan mirror may be employed. Also, instead of the motor, an actuator may be provided so as to change the orientation of the blade 100.

Alternatively, the blade 100 may be fixedly mounted, or otherwise may be omitted. In this case, the optical axis of the semiconductor light source 10 may be moved by means of an actuator. Also, instead of the blade 100, an electro-optical element may be employed. For example, the electro-optical element may be configured as a lens having a refractive index that can be controlled according to a voltage, current, temperature, or the like. The refractive index of the lens may be periodically changed so as to scan the light.

Description has been made regarding the present invention with reference to the embodiments using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A lighting circuit comprising:
   a switching converter structured to supply electric power to a semiconductor light source; and
   a converter controller structured to control the switching converter,
   wherein the converter controller comprises:
      a hysteresis comparator structured to compare a current detection signal that corresponds to a lamp current supplied from the switching converter to the semiconductor light source with an upper-side threshold signal and a lower-side threshold signal determined according to an analog dimming signal, and to generate a control pulse that corresponds to a comparison result;
      a driver structured to drive a switching transistor of the switching converter according to the control pulse; and
      a PWM dimming circuit structured to generate a gradual change signal having a pulse shape by dulling a PWM dimming signal at its edges, and to generate the analog dimming signal having a waveform corresponding to the gradual change signal.

2. The lighting circuit according to claim 1, wherein the PWM dimming circuit comprises a low-pass filter structured to receive the PWM dimming signal, and to generate the gradual change signal.

3. The lighting circuit according to claim 1, wherein the hysteresis comparator comprises:
   a comparator structured to compare the current detection signal with a threshold voltage, and to generate the control pulse;
   a first resistor, a transistor, and a second resistor sequentially arranged in series between a line at which the analog dimming signal is supplied and a ground; and
   a selector structured to receive a first voltage that occurs at a connection node that couples the first resistor and the transistor and a second voltage that occurs at a connection node that couples the transistor and the second resistor, and to output one from among the first voltage and the second voltage according to the control pulse,
   and wherein the threshold voltage corresponds to an output voltage of the selector.

4. The lighting circuit according to claim 1, further comprising:
   a frequency detection circuit structured to generate a frequency detection signal that indicates a frequency of the control pulse; and
   a threshold voltage adjustment circuit structured to change a voltage difference between the upper-side threshold signal and the lower-side threshold signal such that the frequency detection signal approaches a reference value.

5. The lighting circuit according to claim 1, further comprising a modulator structured to generate a modulation signal having a frequency that is lower than a switching frequency of the switching transistor, and to modulate a difference between the upper-side threshold signal and the lower-side threshold signal according to the modulation signal.

6. An automotive lamp comprising:
   a semiconductor light source; and
   the lighting circuit according to claim 1, structured to light the semiconductor light source.

* * * * *